United States Patent
Ren et al.

(10) Patent No.: US 6,507,060 B2
(45) Date of Patent: Jan. 14, 2003

(54) SILICON-BASED PT/PZT/PT SANDWICH STRUCTURE AND METHOD FOR MANUFACTURING THE SAME

(75) Inventors: Tian-Ling Ren, Beijing (CN); Lin-Tao Zhang, Beijing (CN); Li-Tian Liu, Beijing (CN); Zhi-Jian Li, Beijing (CN)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/863,950

(22) Filed: May 23, 2001

(65) Prior Publication Data

US 2002/0175356 A1 Nov. 28, 2002

(51) Int. Cl.$^7$ .................. H01L 29/76; H01L 29/94; H01L 31/062; H01L 31/113; H01L 31/119
(52) U.S. Cl. ................. 257/295; 438/3; 438/792
(58) Field of Search .................. 257/295, 306, 257/308, 310; 438/3, 240, 763, 792, 909

(56) References Cited

U.S. PATENT DOCUMENTS

| | | | | |
|---|---|---|---|---|
| 5,426,075 A | * | 6/1995 | Perino et al. | 438/3 |
| 5,548,475 A | * | 8/1996 | Ushikubo et al. | 257/295 |
| 5,708,284 A | * | 1/1998 | Onishi | 257/295 |
| 5,913,117 A | * | 6/1999 | Lee | 438/240 |
| 5,976,946 A | * | 11/1999 | Matsuki et al. | 438/393 |
| 6,115,281 A | * | 9/2000 | Aggarwal et al. | 365/145 |
| 6,194,228 B1 | * | 2/2001 | Fujiki et al. | 438/3 |
| 6,229,166 B1 | * | 5/2001 | Kim et al. | 257/295 |
| 6,265,230 B1 | * | 7/2001 | Aggarwal et al. | 438/3 |
| 6,297,085 B1 | * | 10/2001 | Aoki et al. | 438/3 |
| 6,337,496 B2 | * | 1/2002 | Jung | 257/295 |
| 6,342,712 B1 | * | 1/2002 | Miki et al. | 257/295 |
| 6,387,712 B1 | * | 5/2002 | Yano et al. | 438/3 |

OTHER PUBLICATIONS

"Low Temperature Perovskite Formation of Lead Zirconate Titanate Thin Films by a Seeding Process" Chi Kong Kwok & Seshu B. Desu/Department of Materials Science and Engineering, Virginia Polytechnic Institute and State University/p. 339–344.

* cited by examiner

Primary Examiner—David Nelms
Assistant Examiner—Andy Huynh
(74) Attorney, Agent, or Firm—J.C. Patents

(57) ABSTRACT

A silicon based PT/PZT/PT sandwich structure is disclosed. A dielectric layer is formed over a semiconductor substrate. The dielectric layer preferably comprises a silicon dioxide layer. A first and the second conductive films are sequentially formed over the dielectric layer. A first ferroelectric film is formed over the first and second conductive films. A second ferroelectric film is formed over the first ferroelectric film. A third ferroelectric film is formed over the second ferroelectric film. The resulting structure is annealed. A third and fourth conductive films are sequentially formed over the third ferroelectric layer. The third and fourth conductive films are patterned.

11 Claims, 4 Drawing Sheets

SILICON-BASED PT/PZT/PT SANDWICH STRUCTURE AND METHOD FOR MANUFACTURING THE SAME

BACKGROUND OF THE INVENTION

1. Filed of Invention

The present invention relates generally to semiconductors and more specifically to a silicon-based PT/PZT/PT sandwich structure.

2. Description of Related Art

Recently, ferroelectric thin films are widely investigated for applications in sensors, actuators, non-volatile memories and photoelectric devices. Lead Zirconate titanate (PZT) thin films are especially well known materials because of their remarkable dielectric, peizoelectric, ferroelectric and photoelectric properties. Therefore it would highly desirable to integrate ferroelectric materials in fabrication of semiconductor devices especially in fabricating memory cell capacitor where a high operating speed is highly demanded. One problem is even though such a design rule is well known, given the complexity integrating these materials and their manufacturing process, and even their use becomes less attractive when cost and size are critical.

Therefore, various deposition methods, such as sol-gel, metalorganic chemical vapor deposition (MOCVD), pulse laser deposition, and sputtering were investigated to fabricate silicon-based PZT thin films as it is highly desirable realize a method of easy operation, low cost, low annealing temperatures and compatibility with semiconductor technology. Among various fabrication techniques, sol-gel method has attracted considerable interest because it can offer several advantages such as simplicity, low cost and easy composition control. In 1993, C. K. Kwok and S. B. Desu presented a novel PZT/PT deposition method to include a PT seeding layer between PZT thin layer and a substrate which can offer nucleation sites and reduce the activation energy for crystallization of PZT thin films.

The present invention provides a silicon based PT/PZT/PT sandwich structure and a method for fabricating the same for further improving the electrical properties of the device and reducing the manufacturing cost.

SUMMARY OF THE INVENTION

The present invention provides a silicon based PT/PZT/PT sandwich structure having improved ferroelectric properties and a method for manufacturing the same.

The present invention provides a PT/PZT/PT sandwich structure that can be used for fabricating a memory cell capacitor so that the operating speed of the memory cell can be substantially enhanced.

The present invention provides a sol-gel process for depositing the ferroelectric thin films for fabricating a silicon-based PT/PZT/PT sandwich structure so that the thermal budget and cost of fabrication are both substantially reduced. The electrical properties of the ferroelectric thin films are substantially improved.

According to the preferred embodiment of the present invention, a silicon based PT/PZT/PT structure comprising a silicon semiconductor substrate. A dielectric layer is formed over a semiconductor substrate. The dielectric layer preferably comprises a silicon dioxide layer. A first and the second conductive films are sequentially formed over the dielectric layer. The first conductive film preferably comprises a Pt film, and the second conductive film comprises a Ti film. A first ferroelectric film is formed over the first and second conductive films. The first ferroelectric film preferably comprises a PT film. A second ferroelectric film is formed over the first ferroelectric film. The second ferroelectric film preferably comprises a PZT film. A third ferroelectric film is formed over the second ferroelectric film. The third ferroelectric film preferably comprises a PT film. The resulting structure is annealed. A third and fourth conductive films are sequentially formed over the third ferroelectric layer. The third and fourth conductive films preferably comprises a Pt and Ti films respectively. The third and fourth conductive films are patterned.

It is to be further understood by those skilled in the art that since the dielectric constant of PT film is smaller compared to PZT film, therefore by placing a PZT film in between two PT thin films, the electrical properties can be substantially improved. Therefore the operating speed of the device can be substantially increased.

It is to be understood by those skilled in the art that the first ferroelectric film comprises a PT film, since the PT film has a similar lattice constant and crystallographic symmetry as those of the second ferroelectric film which comprises a PZT film, therefore PZT film of high quality can be grown on the PT film. Since the nucleation barriers of PT film is lower compared to PZT film, PT film can offer excellent nucleation sites for facilitating complete crystallization of PZT film.

It is to be further understood by those skilled in the art that since the perovskite transformation is also a nucleation reaction, PT film can also effectively facilitate the pervoskite transformation at a comparatively lower temperature. A typical perovskite transformation process or an annealing process require high temperature, for example for PZT film, a temperature of about 900° C. is required to effect the perovskite transformation. By forming a PZT film on the PT film, the perovskite transformation temperature can be effectively reduced from 900° C. to 700° C. Therefore, PT can effectively reduce the fabrication thermal budget thus, the fabrication cost can be substantially reduced. Since the perovskite transformation can be achieved at a lower temperature, there is no risk of adverse effect on the device due to thermal stress, therefore the reliability of the device can be increased.

DESCRIPTION OF THE PREFERRED EMBODIMENTS

Figure 1:
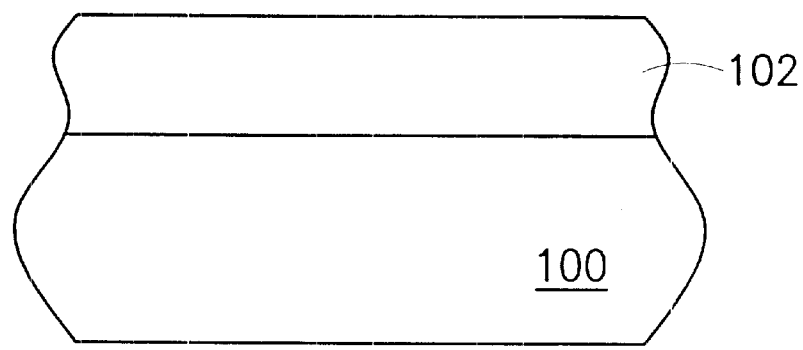
FIGS. 1 through 8 are schematic, cross sectional views showing the progression of manufacturing steps for fabricating a silicon based PT/PZT/PT sandwich structure according to the preferred embodiment of the present invention.

Reference will be made in detail to the present preferred embodiments of the invention, examples of which are illustrated in the accompanying drawings. Wherever possible, the same reference numbers are used in the drawings and the description to refer to the same or like parts.

FIGS. 1 through 7 are schematic, cross sectional views showing the progression of manufacturing steps for fabricating a silicon based PT/PZT/PT sandwich structure according to the preferred embodiment of the present invention.

Referring to FIG. 1, a semiconductor substrate 100 is provided. The semiconductor substrate 100 is preferably made of silicon material. A dielectric layer 102 is formed over a semiconductor substrate 100. The dielectric layer 102 is preferably made of silicon dioxide material formed by performing a conventional deposition technique such as a thermal oxidation. The thickness of the dielectric layer 102 is preferably within a range of about 0.5–2.0 μm.

Figure 2:
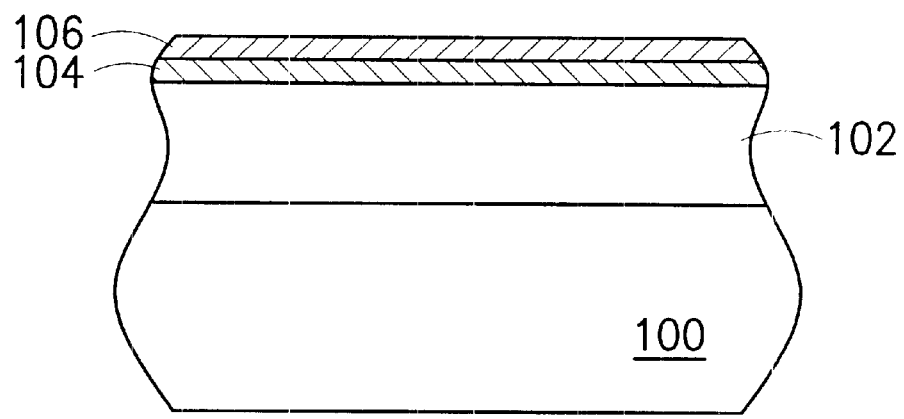
Figure 3:
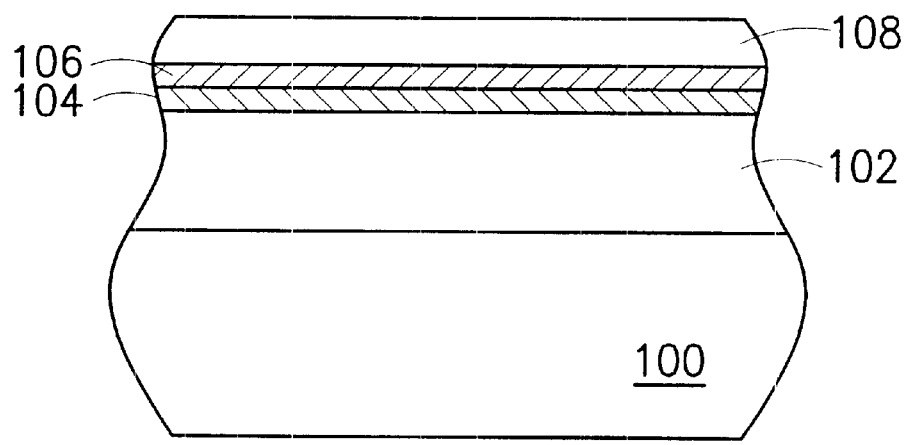

Referring to FIG. 2, a thin first conductive film 104 is formed over the second support layer 102. The first conductive film 104 preferably comprises a Ti material. The first conductive film 104 is preferably formed by performing a sputtering process. The thickness of the first conductive film 104 is preferably within a range of 1000–2000 Å. A thin second conductive film 106 is formed over the first conductive layer 104. The second conductive film 106 preferably comprises a Pt material. The second conductive film 106 is preferably formed by performing a sputtering process. The thickness of the second conductive film 106 is preferably within a range of 50 to 100 Å. The first and the second conductive films forms the lower electrode of the capacitor.

Referring to FIG. 2, a first thin ferroelectric film 108 is spin coated over the second conductive film 106. The first ferroelectric film 108 preferably comprises a PT film. The first ferroelectric film 108 is preferably formed by performing a sol-gel deposition process. A PT precursor solution is prepared by dissolving proper quantities of lead acetate [Pb(CH$_3$COO)$_2$.3H$_2$O] and tetra titanate [Ti(OC$_4$H$_9$)$_4$] in 2-methoxy ethanol to form a PT solution. The composition of lead acetate is preferably within a range of 0.9–1.1% w/v. Since the formation of the above PT solution is simple, the composition and the density of the solution can be easily controlled. Since the density of the above PT solution is low, it is possible to control the spin-speed for forming very thin PT films of desired thickness. The first ferroelectric film 108 dried by heating the substrate at 200° C. over a hot plate for 1 minute. Then the substrate 100 is heated at 600° C. for 2 minutes in a tube oven to remove impurities such as organic residues so that the ferroelectric property of the first ferroelectric film 108 can be improved. The thickness of the first ferroelectric film 108 is preferably within a range of 0.01–0.1 μm.

Figure 4:
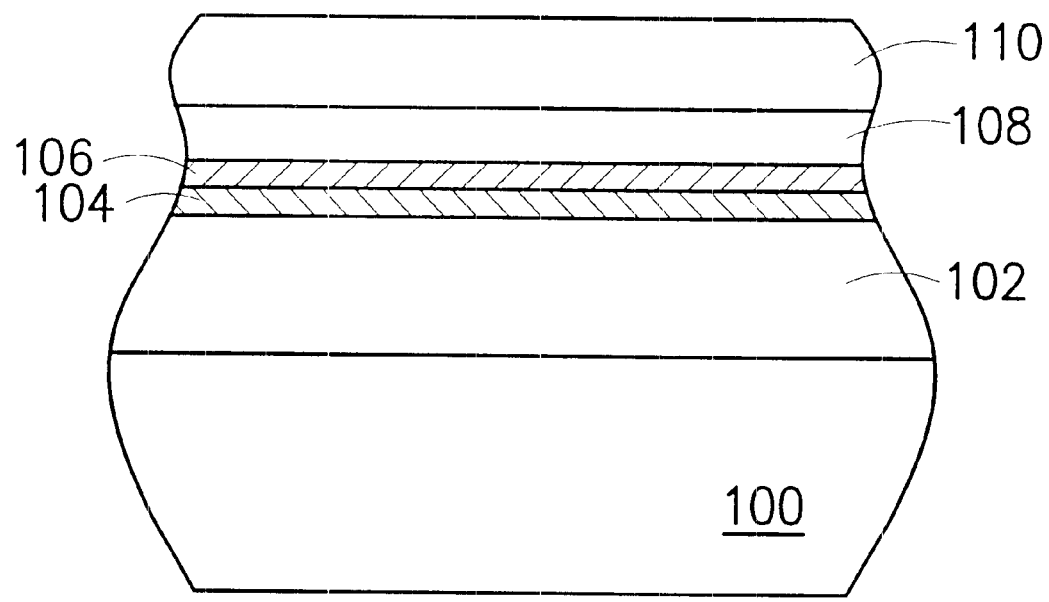

Referring to FIG. 4, a second ferroelectric film 110 is coated over the first ferroelectric film 108. The PZT material preferably having a composition of Pb$_x$(Zr$_y$Ti$_{1-y}$)O$_3$ wherein x=0.9–1.1, y=0.4–0.6. The second ferroelectric film 110 is preferably formed by performing a sol-gel deposition process. A PZT precursor solution is prepared by dissolving proper quantities of lead acetate [Pb(CH$_3$COO)$_2$.3H$_2$O] zirconium nitrate (Zr(NO$_3$)$_4$.5H$_2$O)] and tetra butyl titanate [Ti(OC$_4$H$_9$)$_4$] in 2-methoxy ethanol to form a PZT solution. The composition of the PZT in PZT solution is preferably of [Pb$_x$(Zr$_y$Ti$_{1-y}$)O$_3$] where x=0.9–1.1 and y=0.4–0.6. The above PZT solution is used for forming the second ferroelectric film 110 by a sol-gel process. The second ferroelectric film 110 is dried by heating the substrate 100 at 200° C. over a hot plate for 1 minute. Then the substrate 100 is heated at 600 ° C. for 2 minutes in a tube oven to remove impurities such as organic residues so that the ferroelectric property of the second ferroelectric film 110 can be improved. The thickness of the ferroelectric film 112 is preferably within a range of 0.15–2.0 μm.

Figure 5:
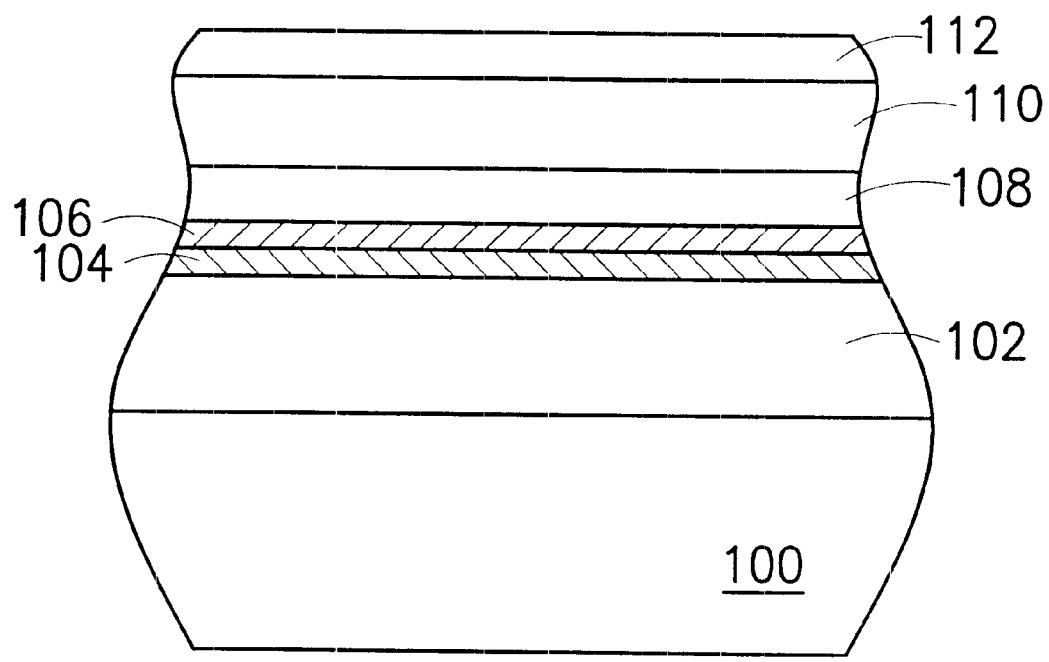

Referring to FIG. 5, a third ferroelectric film 112 is spin coated over the second ferroelectric film 110. The third ferroelectric film 112 preferably comprises a PT film. The third ferroelectric film 112 is preferably formed by performing a sol-gel process by using a PT precursor solution of similar composition as described above. The third ferroelectric film 112 is dried by heating the substrate at 200° C. over a hot plate for 1 minute. Then the substrate 100 is heated at 600° C. for 2 minutes in a tube oven to remove impurities such as organic residues so that the ferroelectric property of the third ferroelectric film 112 can be improved. The thickness of the third ferroelectric film 112 is preferably within a range of 0.01–0.10 μm.

Figure 6:
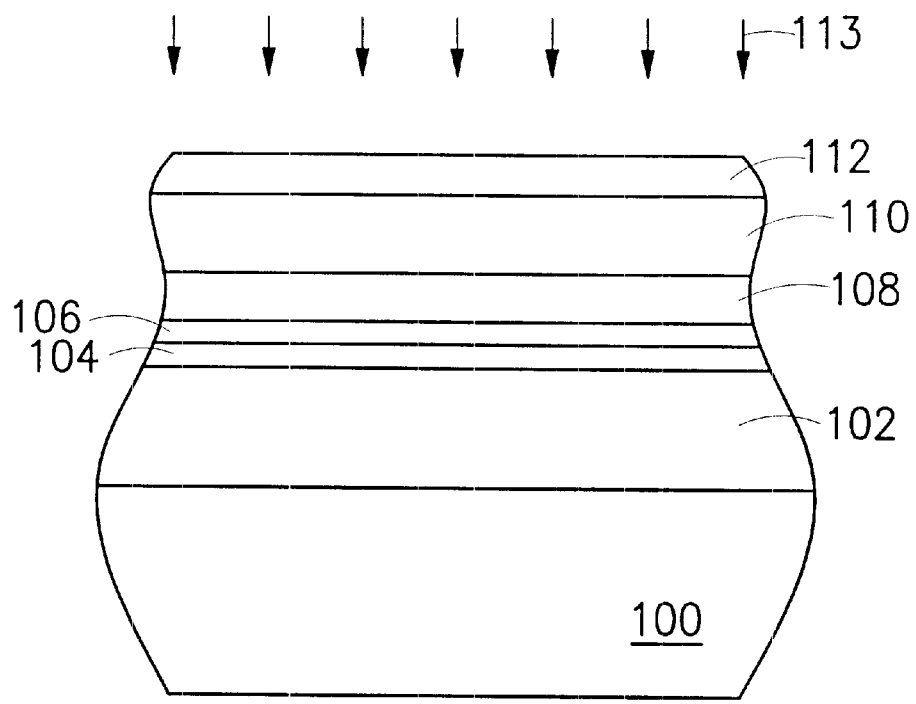

Referring to FIG. 6, the resulting multilayered films are subjected to an annealing process 113 to obtain a well crystallized thin films. The annealing process 113 is preferably carried out at a temperature of about 650–750° C. for a duration of about 30–45 minutes. During the annealing process 113, the first, the second and the third ferroelectric films 108, 110 and 112 are transformed from an amorphous state to a stable well crystallized perovskite state.

Figure 7:
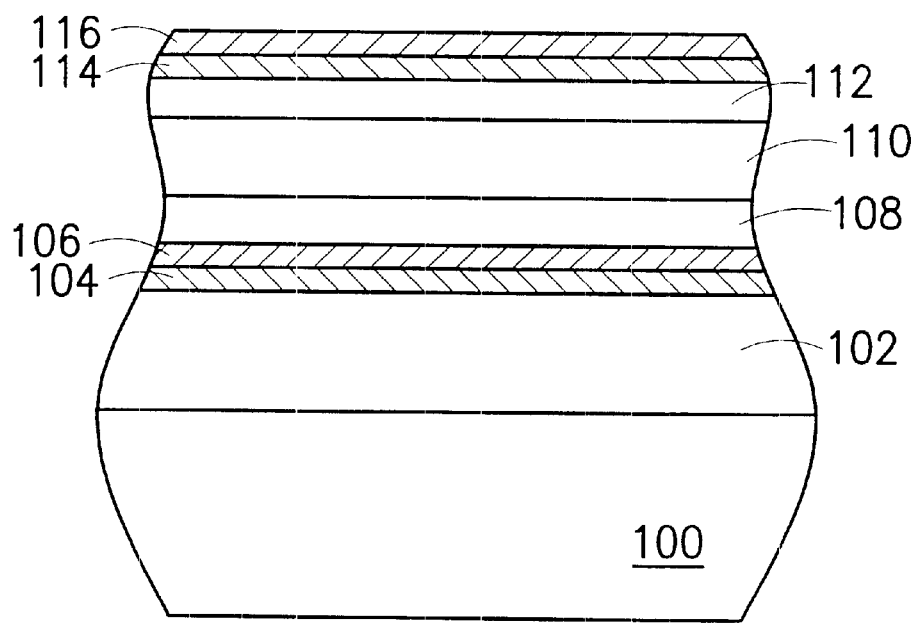

Referring to FIG. 7, a thin third conductive film 114 is formed over the second ferroelectric film 112. The third conductive film 114 preferably comprises a Ti material. The third conductive film 114 is preferably formed by performing a sputtering process. The thickness of the third conductive film 116 is preferably within a range of 1000–2000 Å. A thin fourth conductive film 116 is formed over the third conductive film 114. The fourth conductive film 116 preferably comprises a Pt material. The fourth conductive film 116 is preferably formed by performing a sputtering process. The thickness of the fourth conductive film 116 is preferably within a range of 50–100 Å. The third and the fourth conductive films forms the upper electrode of the capacitor.

Figure 8:
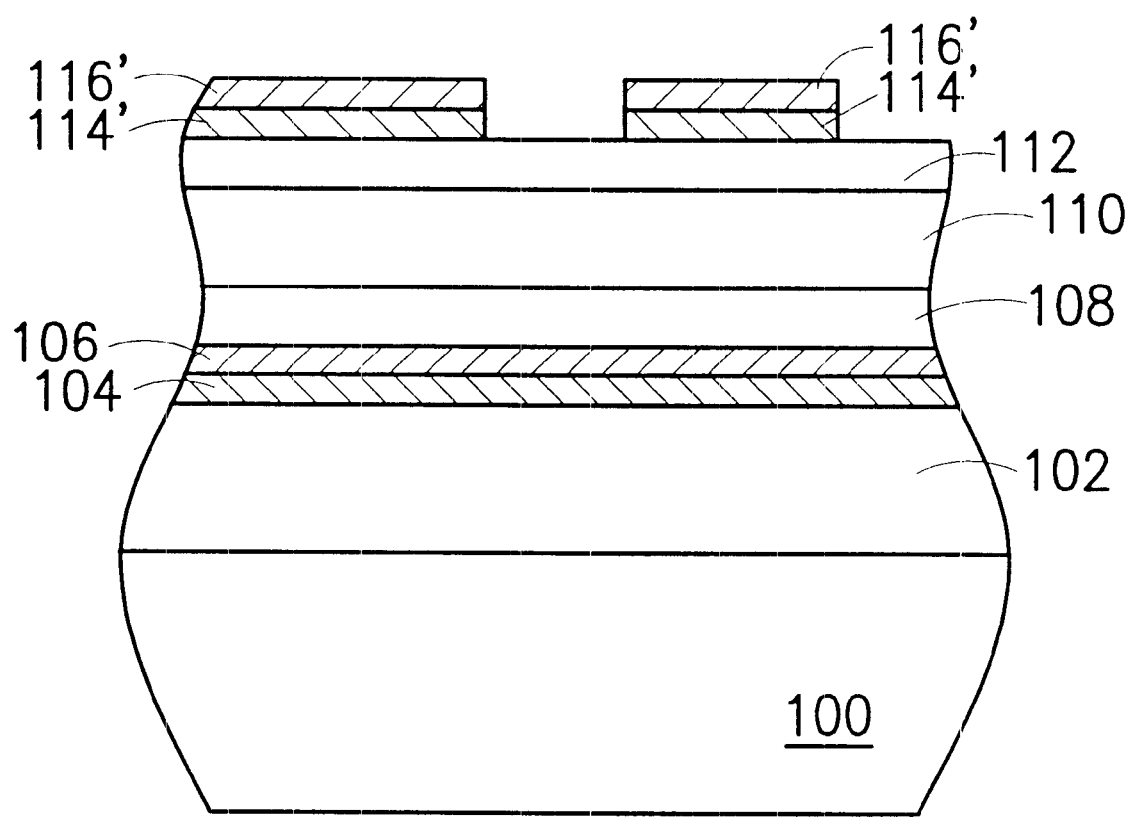

Referring to FIG. 8, the third and the fourth conductive films 114 and 116 are patterned as shown by numeral 114' and 116' respectively.

It is to be understood by those skilled in the art that since the dielectric constant of the PT films 108 and 112 is smaller compared to PZT material, therefore by placing the PZT film 110 in between two PT films 108 and 112, the electrical properties of the resulting structure can be of more superior compared to PT/PZT or PZT structures. The electrical properties such as the coercive field and the leakage current can be substantially reduced and the remnant polarization can be effectively increased. For example, for a PZT film of thickness 0.1–0.5 μm, the coercive field is about 30–50 kV/cm, the leakage current is about 1×10$^{-6}$ to 1×10$^{-8}$ A/cm2 and the remnant polarization is about 3–15 μC/cm$^2$. Whereas for thickness of the layers in the PT/PZT/PT sandwich structure of 0.02/0.2–0.5/0.02 μm, the coercive filed is measured to be 24 KV/cm, the leakage current is 5×10$^{-9}$ A/cm$^2$ and the remnant polarization is 17 μC/cm$^2$. Therefore the operating speed of the device can be substantially increased.

With the approach of the present invention, a second ferroelectric film 110 which is made of a PZT film, is formed on the first ferroelectric film 108 which is made of a PT film, it is to be understood that since the PT film has a similar lattice constant and crystallographic symmetry as those of a PZT film, the PT film can offer excellent nucleation sites for high quality PZT crystal growth.

It is to be further understood by those skilled in the art that the ferroelectric films must be annealed to effect perovskite transformation from an amorphous state to a stable well crystallized perovskite state in order to function effectively. Since the PT film has lower nucleation barriers, and since the perovskite transformation is nucleation reaction, it can effectively reduce the perovskite transformation temperature of the PZT film. Thus, the thermal budget can be effectively decreased. For example, the perovskite transformation temperature of PZT only and PZT/PT structures is about 900° C. and 750° C. respectively. While the perovskite transformation temperature of the PT/PZT/PT sandwich structure is only 600–700° C. Since the perovskite transformation can be achieved at a lower temperature, there is no risk of adverse effect on the device due to thermal stress, therefore the reliability of the device can be increased.

It is to be further understood by those skilled in the art that the present invention provides a simple, compliant and cost effective process for fabricating a silicon-based PT/PZT/PT sandwich structure having improved electrical properties.

The PT/PZT/PT sandwich structures were simulated theoretically to show the effect of the improved PT/PZT/PT sandwich structures. The simulation results of three PT/PZT/PT sandwich structures examples according to the present invention are listed below.

EXAMPLE 1

For the thickness of the layers in the PT/PZT/PT sandwich structure of 0.02/0.2/0.02 micron, the dielectric constant is measured to be 920, the coercive filed is measured to be 24 KV/cm and the remnant polarization is 17 micro-C/cm$^2$ and the leakage current is $5 \times 10^{-9}$ A/cm$^2$.

EXAMPLE 2

For the thickness of the layers in the PT/PZT/PT sandwich structure of 0.04/1/0.02 micron, the dielectric constant is measured to be 915, the coercive filed is measured to be 20 KV/cm and the remnant polarization is 19 micro-C/cm$^2$ and the leakage current is $2 \times 10^{-9}$ A/cm$^2$.

EXAMPLE 3

For the thickness of the layers in the PT/PZT/PT sandwich structure of 0.1/1.5/0.1 micron, the dielectric constant is measured to be 900, the coercive filed is measured to be 18 KV/cm and the remnant polarization is 23 micro-C/cm$^2$ and the leakage current is $1 \times 10^{-9}$ A/cm$^2$.

CONCLUSION: Compared to the electrical properties of the PZT/PT and PZT only structures, the coercive field and the leakage current of the sandwich structure are decreased substantially, while the remnant polarization is increased.

While the best mode utilizes the above specific thickness PT/PZT/PT sandwich structure, however it should be understood that the present invention is applicable to PT/PZT/PT sandwich structures with PT/PZT/PT layers of different thickness and different composition of PZT and PT material thereof, may be used to practice the present invention.

It is to be understood by those skilled in the art that the thickness of each layer in the PT/PZT/PT sandwich structure is designed based on the analysis of the coercive field, the leakage current and the remnant polarization values. The aim of the design is to further improve the electrical properties of the structure without affecting the structure firmness. The design parameters of each layer is as below. The thickness of the first PT film is about 0.01–0.1 $\mu$m. The thickness of PZT layer is about 0.15–2.0 $\mu$m and the composition of PZT is $Pb_x(Zr_yT_{1-y})O_3$ wherein x 0.9–1.1, y=0.4–0.6. The thickness of the second PT film is about 0.01–0.1 $\mu$m. Therefore the present invention provides a simple, compliant design parameters. Because the present invention shows a sol-gel process for forming the thin ferroelectric film, and the advantage of using the PT films for lowering the annealing temperature, the manufacturing process can be simplified and the cost of fabrication is substantially reduced.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

It is to be understood that the foregoing general description and the following detailed description are exemplary, and are intended to provide further explanation of the invention as claimed.

What is claimed is:

1. A PT/PZT/PT sandwich structure for integrated circuit device, the structure comprising:

a semiconductor substrate;

a dielectric layer formed over the substrate;

a first conductive metal film formed over the dielectric layer;

a second conductive metal film formed over the first conductive metal film;

a first ferroelectric film formed over the second conductive metal film;

a second ferroelectric film formed over the first ferroelectric film;

a third ferroelectric film formed over the second ferroelectric film, wherein dielectric constants of the first and the third ferroelectric films are lower than that of the second ferroelectric film, wherein the first and the third ferroelectric films are made of a same material, and wherein a thickness ratio of the second ferroelectric film to the first or the third ferroelectric film ranges from about 1 to about 200;

a third conductive metal film formed over the second ferroelectric film; and a fourth conductive metal film formed over the third metal conductive film.

2. The structure according to claim 1, wherein the first and the third ferroelectric films comprises a PT film, wherein the lead content in the PT film is within a range of 0.9–1.1% w/v.

3. The structure according to claim 1, the thickness of the first and third ferroelectric films is within a range between 0.01 to 0.10 $\mu$m.

4. The structure according to claim 1, wherein the second ferroelectric film is formed in between the first and the third ferroelectric films, wherein the second ferroelectric film comprises a PZT film, and the first, the third ferroelectric films comprises a PT film.

5. The structure according to claim 4, wherein the composition of the PZT film comprises of $Pb_x(Zr_yTi_{1-y})O_3$ wherein x=0.9–1.1, y=0.4–0.6.

6. The structure according to claim 1, wherein the thickness of the second ferroelectric film are within a range of 0.15 to 2.0 $\mu$m.

7. The structure according to claim 1, wherein the first, the second and the third ferroelectric films is formed by performing a sol-gel process.

8. The structure according to claim 1, wherein after the third ferroelectric layer is formed, an annealing process is performed.

9. The structure according to claim 8, wherein the annealing step is carried out at a temperature of 650–700° C. for a duration of 30–45 minutes, wherein the first, the second and the third ferroelectric films are transformed from an amorphous form to a stable well crystallized perovskite form.

10. The structure according to claim 1, wherein the first and the third conductive films comprises a Ti film, wherein the thickness of the first and the third conductive films is within a range of 1000–2000 Å.

11. The structure according to claim 1, wherein the second and the fourth conductive films comprises a Pt film, wherein the thickness of the second and the fourth conductive films is within a range of 50–100 Å.

* * * * *